US008840265B2

(12) United States Patent
Moon et al.

(10) Patent No.: US 8,840,265 B2
(45) Date of Patent: Sep. 23, 2014

(54) ILLUMINATION APPARATUS EMPLOYING LIGHT-EMITTING DEVICE PACKAGE

(75) Inventors: Kyung-mi Moon, Suwon-si (KR);
Young-hee Song, Seongnam-si (KR);
Ill-heung Choi, Hwaseong-si (KR);
Jeong-wook Lee, Yongin-si (KR);
Young-jin Lee, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 458 days.

(21) Appl. No.: 13/099,972

(22) Filed: May 3, 2011

(65) Prior Publication Data

US 2011/0267814 A1 Nov. 3, 2011

(30) Foreign Application Priority Data

May 3, 2010 (KR) .................. 10-2010-0041445

(51) Int. Cl.
*F21S 4/00* (2006.01)
*F21K 99/00* (2010.01)
*F21V 29/00* (2006.01)
*F21V 23/06* (2006.01)

(52) U.S. Cl.
CPC .............. *F21K 9/17* (2013.01); *F21V 29/2293* (2013.01); *F21V 23/06* (2013.01); *F21S 4/008* (2013.01)
USPC .................. 362/219; 362/217.13; 362/217.17; 362/249.02; 362/311.02; 362/373; 257/99

(58) Field of Classification Search
CPC ............ F21K 9/00; F21S 4/008; F21V 13/04; F21V 17/04; F21V 23/06; F21V 29/004; F21V 29/2206; F21V 29/2293; F21Y 2103/003

USPC .................... 362/218, 219, 222, 225, 217.13, 362/217.17, 249.02, 311.02, 800, 294, 373; 257/98, 99

See application file for complete search history.

(56) References Cited

U.S. PATENT DOCUMENTS 6,882,111 B2 * 4/2005 Kan et al. ................ 362/217.17
8,220,976 B2 * 7/2012 Liu et al. ...................... 362/800
(Continued)

FOREIGN PATENT DOCUMENTS

CN 201053620 Y 4/2008
CN 101364585 A 2/2009
(Continued)

OTHER PUBLICATIONS

Extended European Search Report, issued in European Patent Application No. 11 163 644.5, dated Sep. 13, 2011.
(Continued)

*Primary Examiner* — Stephen F Husar
(74) *Attorney, Agent, or Firm* — McDermott Will & Emery LLP

(57) ABSTRACT

An illumination apparatus includes a light source unit comprising at least one light source module comprising a plurality of light-emitting device chips and a lead frame on which the light-emitting device chips are mounted and which connects the mounted light-emitting device chips; a diffusion cover having an interior space in which the light source module is accommodated and diffusing light emitted from the light source module; and an installation portion formed adjacent to the diffusion cover to install the light source module.

19 Claims, 8 Drawing Sheets

(56) References Cited

U.S. PATENT DOCUMENTS

2008/0080200 A1     4/2008    Robbins et al.
2010/0072507 A1     3/2010    Huang et al.
2010/0295468 A1*   11/2010   Pedersen et al. .............. 362/218
2011/0267814 A1    11/2011   Moon et al.

FOREIGN PATENT DOCUMENTS

| CN | 201232878 Y | 5/2009 |
| CN | 102909005 A | 2/2013 |
| DE | 20 2008 017 219 U1 | 5/2009 |
| JP | 2006-186197 | 7/2006 |
| KR | 10-2010-0012952 A | 2/2010 |
| KR | 10-2010-0016676 A | 2/2010 |

OTHER PUBLICATIONS

Chinese Office Action issued in corresponding Chinese Application No. 201110110410.8, dated Jul. 22, 2014.

* cited by examiner

ILLUMINATION APPARATUS EMPLOYING LIGHT-EMITTING DEVICE PACKAGE

CROSS-REFERENCE TO RELATED PATENT APPLICATION

This application claims the benefit of Korean Patent Application No. 10-2010-0041445, filed on May 3, 2010, in the Korean Intellectual Property Office, the disclosure of which is incorporated herein in its entirety by reference.

BACKGROUND OF THE INVENTION

1. Field of the Invention

The present invention relates to an illumination apparatus using a light-emitting device package.

2. Description of the Related Art

Light-emitting diodes (LED) constituting a light-emitting source through a P-N junction of a compound semiconductor are semiconductor devices capable of displaying various light colors. Recently, blue LEDs and UV LEDs embodied using a nitride having high physical and chemical characteristics have appeared. White light or other different monochromatic light may be made by using a blue or UV LED and a fluorescent material, and thus an applicable range of an LED is extending.

Such a LED has a long lifespan, can be made small and light, and has a high directivity of light and thus enables a low-voltage driving. In addition, LEDs are strong on impact and vibration, do not require a preheating time and a complicated driving, and can be packaged in various ways, and thus the LEDs are applicable for various use.

For example, LEDs may be used as a light source module for illumination. In this case, the LEDs undergo a first packaging for mounting an LED chip, a fluorescent material, a lens on a lead frame and a second packaging for mounting a plurality of light-emitting device packages made in the above-described way and other elements on a circuit substrate in order to form a circuit.

Also, in order to form the light-emitting device chip, such as an LED, as an illumination apparatus, the need for a method capable of reducing manufacturing cost has increased. Thus, research into a method capable of reducing manufacturing cost and simplifying a manufacturing process is being conducted.

SUMMARY OF THE INVENTION

The present invention provides an illumination apparatus using a lead frame capable of simplifying a package process and a plurality of light-emitting device chips mounted on the lead frame.

According to an aspect of the present invention, there is provided an illumination apparatus including: a light source unit including at least one light source module including a plurality of light-emitting device chips and a lead frame on which the light-emitting device chips are mounted and which connects the mounted light-emitting device chips; a diffusion cover having an interior space in which the light source module is accommodated and diffusing light emitted from the light source module; and an installation portion formed adjacent to the diffusion cover to install the light source module.

The lead frame may include a plurality of mounting portions on which the light-emitting device chips are mounted, a plurality of connecting portions for connecting the light-emitting device chips on a circuit, and a terminal unit extending from at least one of the connecting portions.

The connecting portions may include an intermediate connecting portion for connecting the mounted light-emitting device chips in series, a first connecting portion electrically connected to a first electrode of the light-emitting device chip disposed at a front end of a series circuit from among the mounted light-emitting device chips, and a second connecting portion electrically connected to a second electrode of the light-emitting device chip disposed at a rear end of the series circuit from among the mounted light-emitting device chips, wherein the terminal unit may include a first terminal extending from the first connecting portion and a second terminal extending from the second connecting portion.

The first connecting portion, the intermediate connecting portion, and the second connecting portion are arranged in a line; the first terminal may include a first front terminal disposed at a front end of the arrangement and a first rear terminal disposed at a rear end of the arrangement; the second terminal may include a second front terminal disposed at a front end of the arrangement and a second rear terminal disposed at a rear end of the arrangement; and the connecting portion may include a first extending portion extending from the first connecting portion to the first rear terminal along a side of the arrangement, and a second extending portion extending from the second connecting portion to the second front terminal along the other side of the arrangement.

A region of the lead frame, other than the mounting portions, is exposed in the interior space.

The installation portion is divided into two parts spaced apart by interposing the light source module therebetween, and each of the two parts may include a groove with which the light source module is engaged.

A plurality of through-holes are formed in the installation portion.

The diffusion cover has any one shape selected from the group consisting of a cylindrical shape, an oval shape, a polyhedral shape, and a polyhedral shape of which edges are rounded.

The diffusion cover may include at least one hole so that the interior space is connected to the outside.

In the lead frame, remaining regions, except for the terminal unit, are coated with an insulating material. The installation portion has a heat radiation structure.

The heat radiation structure may include: a loading plate on which the light source module is loaded; and two engaging portions that each include a groove and are formed at both sides of the loading plate so as to engage with both edges of the light source module.

A shape of the heat radiation structure may include a part of a cylindrical shape.

The diffusion cover may include a part of any one shape selected from the group consisting of a cylindrical shape, an oval shape, a polyhedral shape, and a polyhedral shape of which edges are rounded, wherein the loading plate extends in a direction parallel to an axis of the shape of the diffusion cover and is disposed to be lower than a center of a cross-section of the shape of the diffusion cover.

The light source unit may include a plurality of light source modules; a front terminal unit and a rear terminal unit are respectively disposed at both ends of each of the light source modules; and the rear terminal unit of any one light source module from among the light source modules is coupled to the front terminal unit of the adjacent light source module.

The front terminal unit is formed in a straight and flat shape; wherein the rear terminal unit is formed in a bent shape so as to engage with the front terminal unit, and an end of the bent shape of the rear terminal unit is bent to have a concave part.

When the rear terminal unit of any one light source module from among the light source modules is coupled to the front terminal unit of the adjacent light source module through soldering, the junction of the end of the bent shape of the rear terminal unit and the front terminal unit is soldered.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
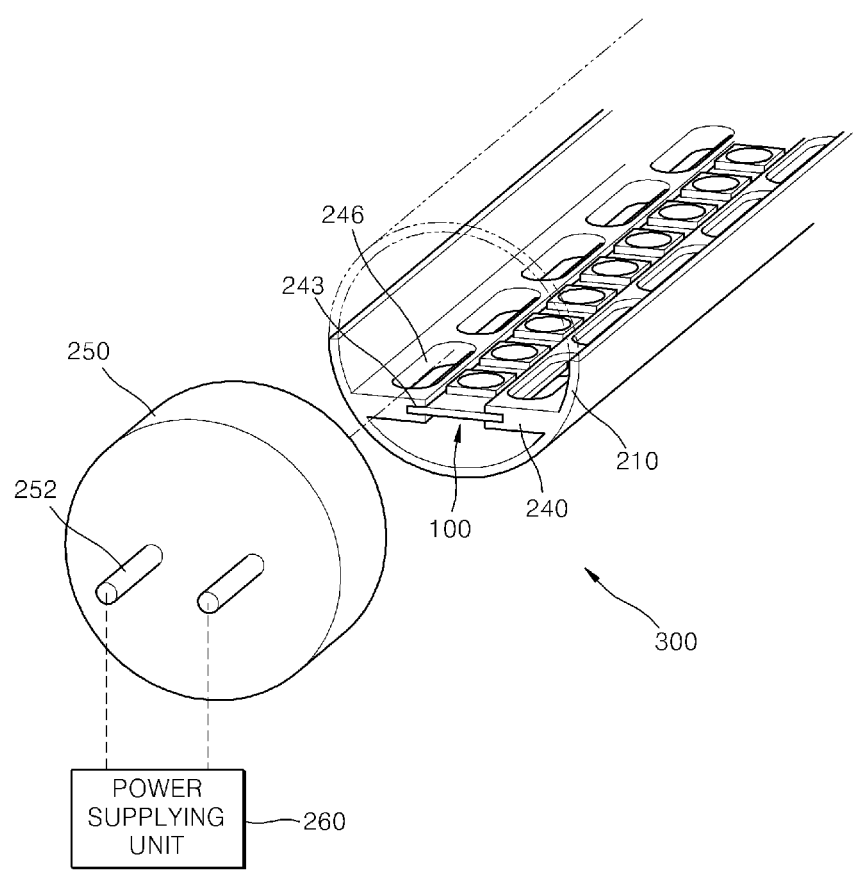
FIG. 1 is a schematic perspective view illustrating an illumination apparatus according to an embodiment of the present invention.

Hereinafter, the present invention will be described in detail by explaining exemplary embodiments of the invention with reference to the attached drawings. The same reference numerals in the drawings denote the same element. In the drawings, the thicknesses of layers and regions are exaggerated for clarity.

Figure 2:
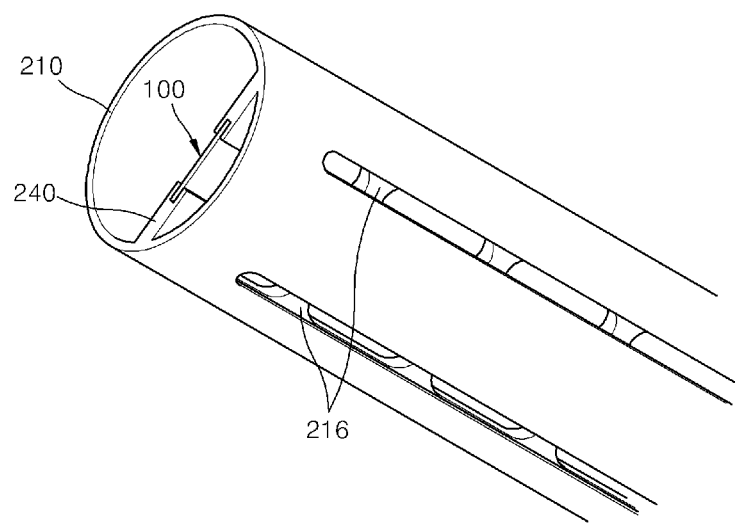
FIG. 2 is a perspective view illustrating a bottom surface of a diffusion cover of the illumination apparatus of FIG. 1.
Figure 3:
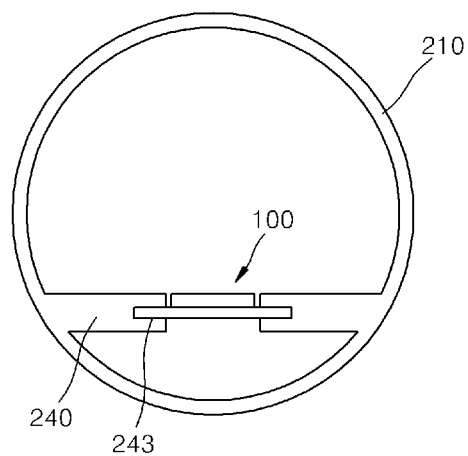
FIG. 3 is a cross-sectional view illustrating the illumination apparatus of FIG. 1, take in a direction perpendicular to an axis of the diffusion cover.

FIG. 1 is a schematic perspective view illustrating an illumination apparatus 300 according to an embodiment of the present invention. FIG. 2 is a perspective view illustrating a bottom surface of a diffusion cover 210 of the illumination apparatus 300 of FIG. 1. FIG. 3 is a cross-sectional view illustrating the illumination apparatus 300 of FIG. 1, taken in a direction perpendicular to an axis of the diffusion cover 210.

Referring to FIGS. 1 through 3, the illumination apparatus 300 includes a light source unit including at least one light source module 100, the diffusion cover 210 having an interior space where the light source module 100 is accommodated and diffusing light emitted from the light source module 100, and an installation portion 240 formed adjacent to the diffusion cover 210 to install the light source module 100. In addition, a cap 250 including a plurality of terminals 252 to be connected to a power supplying unit 260 may be coupled to both ends of the diffusion cover 210.

The light source unit includes at least one light source module 100 including a plurality of light-emitting device chips and a lead frame on which the plurality of light-emitting device chips are mounted and that connects the light-emitting device chips on a circuit. Details about the light source module 100 will be described later with reference to FIGS. 4 through 8. The light source module 100 has a structure in which the lead frame is exposed at portions other than a predetermined portion where the light-emitting device chips are mounted. The lead frame is formed of a metal-based material, and thus has a heat radiation effect. That is, heat generated from the light-emitting device chips may be effectively emitted to the air through the lead frame.

The diffusion cover 210 has the interior space in which the light source module 100 is accommodated, and diffuses light emitted from the light source module 100. The diffusion cover 210 may be formed of a transparent plastic including polycarbonate (PC), poly(methyl methacrylate) (PMMA), or acrylic, glass, or a semitransparent plastic. In addition, the diffusion cover 210 may be formed of a transparent material coated with a phosphor material or a diffuser. As will be described later, a phosphor material may be coated on a light-emitting diode (LED) chip employed in the light source module 100 for color conversion, and color conversion and definition may be controlled by coating the phosphor material or the diffuser on the diffusion cover 210.

The diffusion cover 210 may have a cylindrical shape as illustrated in FIGS. 1 through 3, but the present invention is not limited thereto. The diffusion cover 210 may have a cross-section having various tube shapes. For example, the diffusion cover 210 may have an elliptic tube shape, a polyhedron tube shape, or a polyhedron tube shape of which edges are processed. The diffusion cover 210 may employ various shapes disclosed in Korean Design Applications No. 2010-012853, No. 2010-012167, No. 2010-012522, No. 2010-012168, No. 2010-011792, and No. 2010-013225.

The diffusion cover 210 may include at least one hole 216 through which the interior space may be connected to the outside. The hole 216 may effectively emit heat generated from the light source module 100 to the outside. The shape and number of holes 216 are not limited and may be properly controlled.

The light source module 100 is installed in the installation portion 240. As illustrated in FIGS. 1 and 2, the installation portion 240 may extend in a direction parallel to an axis of the diffusion cover 210. The installation portion 240 is divided into two parts spaced apart from each other by interposing the light source module 100 therebetween. Each of the two parts may include a groove 243 with which the light source module 100 is engaged. The installation portion 240 and the diffusion cover 210 may be formed as one body, or the installation portion 240 may be formed separately to be coupled in the diffusion cover 210. A plurality of holes 246 may be formed in the installation portion 240. The holes 246 are formed to more effectively emit heat generated from the light source module 100 to the outside. The shape and number of holes 246 are not limited and may be properly controlled.

Referring to FIG. 3, the installation portion 240 may be disposed below the center of the diffusion cover 210 having a cylindrical shape. That is, the light source module 100 is disposed away from the diffusion cover 210 as far as possible in order to realize increased color uniformity and luminance uniformity by increasing a mixing effect of light emitted from the light-emitting device chips. As such, luminance and uniformity of color may be improved by controlling the position of the light source module 100 in the interior space of the diffusion cover 210. In this case, a binning spec of the light-emitting device chip employed in the light source module 100 may be managed to be wider, and thus is an advantage in terms of a yield.

The power supplying unit 260 may include an interface for receiving power and a power controller for controlling power supplied to the light source module 100. For example, the power supplying unit 260 may include a fuse for blocking overcurrent and an electromagnetic wave shielding filter for shielding an electromagnetic wave obstacle signal. When alternating current (AC) is input to the power supplying unit 260, the power supplying unit 260 may include a rectifier for converting AC into direct current (DC) and a constant voltage controller for changing the voltage to be suitable for the light source module 100. If the power is a DC source, e.g. a battery having a voltage suitable for the light source module 100, the rectifier and the constant voltage controller may be omitted. In addition, when a device such as an AC-LED is used as the light-emitting device chip of the light source module 100, AC may be directly applied to the light source module 100. In this case, the rectifier and the constant voltage controller may also be omitted.

Figure 4:
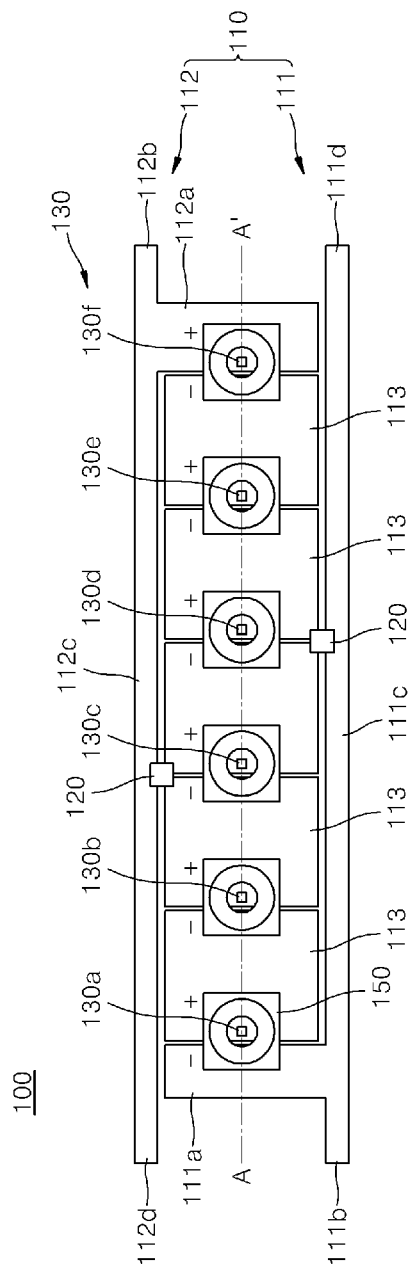
FIG. 4 is a schematic plane view illustrating a light source module employed in the illumination apparatus of FIG. 1.
Figure 5:
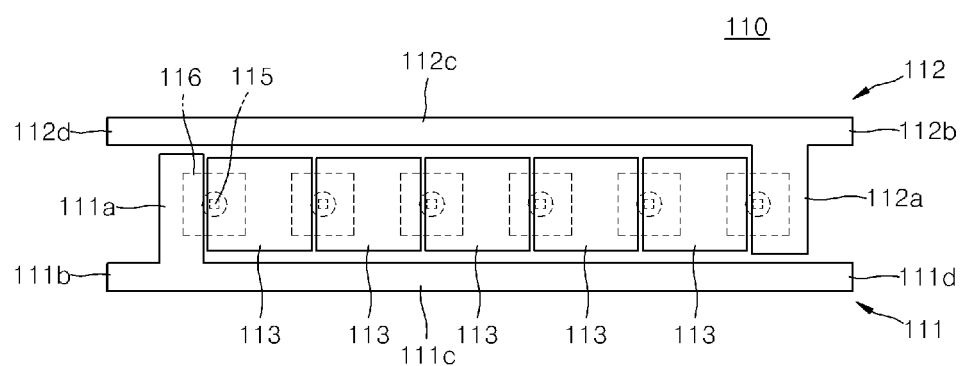
FIG. 5 is a schematic view illustrating a position relation between a lead frame and a light-emitting device chip used in the light source module of FIG. 4.
Figure 6:
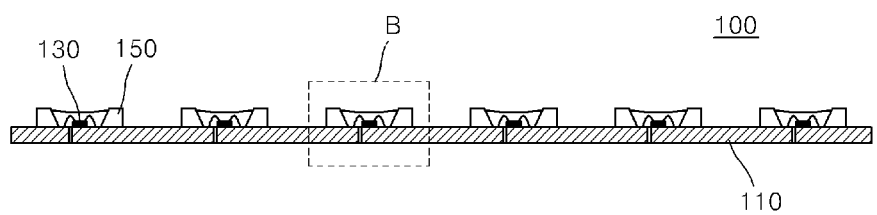
FIG. 6 is a schematic cross-sectional side view illustrating the light source module taken along a line A-A' of FIG. 4.
Figure 7:
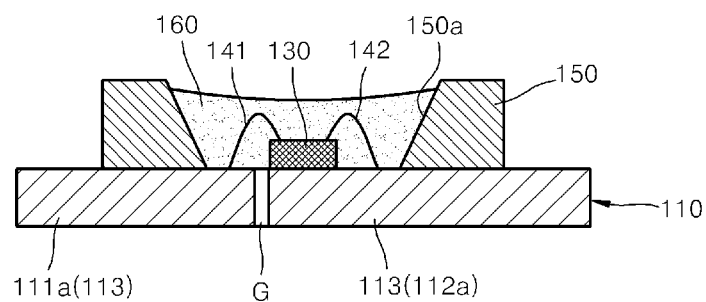
FIG. 7 is an enlarged cross-sectional view of a region B of FIG. 6.
Figure 8:
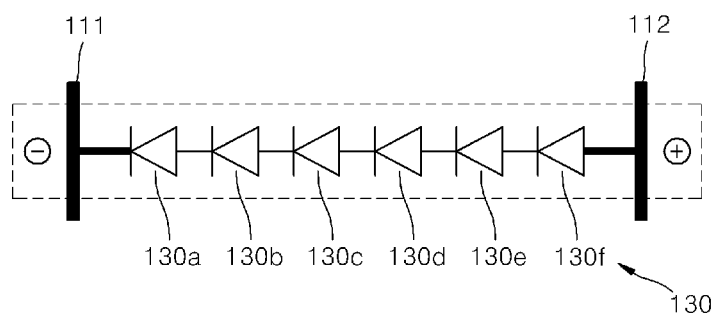
FIG. 8 is a circuit diagram illustrating the light source module of FIG. 4.

Hereinafter, details of the light source module 100 will be described with reference to FIGS. 4 through 8. FIG. 4 is a schematic plane view illustrating the light source module 100 employed in the illumination apparatus 300 of FIG. 1. FIG. 5 is a schematic view illustrating a position relation between a lead frame 110 and a plurality of light-emitting device chips 130 used in the light source module 100 of FIG. 4. FIG. 6 is a schematic cross-sectional side view illustrating the light source module 100 taken along a line A-A' of FIG. 4. FIG. 7 is an enlarged cross-sectional view of a region B of FIG. 6. FIG. 8 is a circuit diagram illustrating the light source module 100 of FIG. 4.

Referring to FIGS. 4 through 8, the light source module 100 includes the plurality of light-emitting device chips 130, the lead frame 110 for electrically connecting the light-emitting device chips 130 to the outside, a coupling member 120 for fixing individual parts of the lead frame 110, and a plurality of reflection cavities 150 each in which a reflection surface 150a for reflecting light emitted from each of the light-emitting device chips 130 and guiding the light to the outside is formed.

The lead frame 110 may be formed of a metal plate such as aluminum or copper so as to have a shape illustrated in FIG. 5, by performing pressing and etching processes. The lead frame 110 includes a first frame unit 111, a second frame unit 112, and a plurality of intermediate connecting portions 113 that are separated from one another. The first frame unit 111, the second frame unit 112, and the intermediate connecting portions 113 separated from one another are coupled to one another and fixed by the coupling member 120 and the reflection cavities 150.

The first frame unit 111 includes a first connecting portion 111a, a first front terminal 111b, a first extending portion 111c, and a first rear terminal 111d. The first connecting portion 111a is connected to a negative electrode of a first light-emitting device chip 130a disposed at the foremost end from among the light-emitting device chips 130. Also, the first front terminal 111b extends in a direction of an anterior end of the first connecting portion 111a, and the first rear terminal 111d extends in a direction of a posterior end of the first connecting portion 111a. The first extending portion 111c connecting the first connecting portion 111a and the first rear terminal 111d is spaced apart from the intermediate connecting portions 113 by a predetermined interval along a side of an arrangement of the light-emitting device chips 130.

The second frame unit 112 includes a second connecting portion 112a, a second rear terminal 112b, a second extending portion 112c, and a second front terminal 112d. The second connecting portion 112a is connected to a positive electrode of a sixth light-emitting device chip 130f disposed at a rearmost end from among the light-emitting device chips 130 arranged in a line. Also, the second rear terminal 112b extends in a direction of a posterior end of the second connecting portion 112a, and the second front terminal 112d extends in a direction of an anterior end of the second connecting portion 112a. The second extending portion 112c connecting the second connecting portion 112a and the second front terminal 112d is spaced apart from the intermediate connecting portions 113 by a predetermined interval along the other side of the arrangement of the light-emitting device chips 130.

The first front terminal 111b and the second front terminal 112d are disposed at a front end of the light source module 100, and become a negative terminal and a positive terminal, respectively. The first rear terminal 111d and the second rear terminal 112b are disposed at a rear end of the light source module 100, and become a negative terminal and a positive terminal, respectively. Accordingly, the first front terminal 111b, the second front terminal 112d, the first rear terminal 111d, and the second rear terminal 112b constitute a terminal unit of the light source module 100. The light source module 100 is inserted into any one of various connectors, such as a socket, through an exposed terminal unit, and thus may be used as an illumination module of an illumination apparatus, and a process, for example, soldering on an additional printed circuit board (PCB), is not necessary. The terminal unit of the current embodiment includes the first and second front terminals 111b and 112d and the first and second rear terminals 111d and 112b, but one of the front terminals and the rear terminals may be omitted.

The intermediate connecting portions 113 are disposed between the first connecting portion 111a and the second connecting portion 112a. The intermediate connecting portion 113 connects a positive electrode and a negative electrode between the light-emitting device chips 130. The number of light-emitting device chips 130 may be one more than that of intermediate connecting portions 113. As illustrated in FIGS. 4 to 6, if there are six light-emitting device chips 130, there may be five intermediate connecting portions 113.

The intermediate connecting portions 113 connect the light-emitting device chips 130 on a circuit in series together with the first connecting portion 111a and the second connecting portion 112a. The circuit of the light-emitting device chips 130 may be illustrated as the circuit diagram of FIG. 8.

A plurality of mounting portions 115 on which the respective light-emitting device chips 130 are mounted are formed on the intermediate connecting portions 113 and the second connecting portion 112a. That is, the mounting portion 115 is formed in a part of each of the intermediate connecting portions 113 and the second connecting portion 112a, and a bonding pad (not shown) for facilitating bonding between the light-emitting device chips 130 may be attached to the mounting portion 115. Also, a reflection cavity forming unit 116 represents a region where the reflection cavity 150 is formed. The reflection cavity forming unit 116 is disposed on adjacent regions of the first connecting portion 111a, the intermediate connecting portions 113, and the second connecting portion 112a, and thus the first connecting portion 111a, the intermediate connecting portions 113, and the second connecting portion 112a are fixed and coupled to one another by the reflection cavities 150.

Furthermore, an insulating layer (not shown) may be formed on remaining parts except for a part for electrically connecting the light-emitting device chips 130 and a terminal unit of the lead frame 110 by coating the remaining part with an insulating material. The insulating layer may be formed of the same material as that of the reflection cavity 150 and may be formed when forming the reflection cavity 150.

The light-emitting device chips 130 may be a light emitting diode chip including a positive electrode and a negative electrode as elements. The light emitting diode chip may emit blue, green, and red light according to a material of a compound semiconductor constituting the light emitting diode chip. For example, the light emitting diode chip for emitting blue light may include an active layer having a plurality of quantum well layers each in which GaN and InGaN are alternately formed, and a p-type clad layer and an N-type clad layer, which are formed of a compound semiconductor of $Al_xGa_yN_z$, may be formed on and under the active layer. Furthermore, a phosphor material may be coated on a surface of the light emitting diode chip so as to emit white light. In addition, light emitting diode chips disclosed in Korean Patent Applications No. 2010-015422 and No. 2010-018259 may be used as the light-emitting device chip of the current embodiment. In the current embodiment, the light-emitting device chip is a light emitting diode chip, but the present invention is not limited thereto. For example, the light-emitting device chips 130 may be a UV light diode chip, a laser diode chip, an organic light-emitting diode chip, or the like.

The light-emitting device chips 130 are arranged in a line and are connected on a circuit in series by the lead frame 110. As illustrated in FIG. 7, a substrate surface of each of the light-emitting device chips 130 is bonded to the intermediate connecting portion 113 or the second connecting portion 112a of the lead frame 110 and is electrically wired up to the first connecting portion 111a, the intermediate connecting portions 113, and the second connecting portion 112a that are spaced apart from one another by wires 141 and 142. A gap G formed between the first connecting portion 111a, the intermediate connecting portions 113, and the second connecting portion 112a may be filled with a material that is same as that of the reflection cavity 150 or may be empty.

In the current embodiment, there are six light-emitting device chips 130, but the present invention is not limited thereto. The number of light-emitting device chips 130 may be properly selected according to a power source of an illumination apparatus including the light source module 100. Meanwhile, in the current embodiment, the lead frame 110 has a pattern repeated in a direction in which the light-emitting device chips 130 are arranged in a line, and thus the number of intermediate connecting portions 113 may be easily changed according to the number of light-emitting device chips 130 required.

The reflection cavity 150 may be disposed on each of the light-emitting device chips 130. A reflection surface 150a of the reflection cavity 150 reflects light emitted from the light-emitting device chip 130 so as to emit the light at a predetermined angle, thereby improving an efficiency in which light emitted from the light-emitting device chip 130 is extracted to the outside. The reflection cavity 150 may be formed together with the coupling member 120 through an injection molding process. In this case, the reflection cavity 150 may be formed of an insulating material that is the same as that of the coupling member 120.

After the light-emitting device chips 130 are installed, a transparent resin 160 may be filled in an interior space of the reflection cavity 150 so as to protect the light-emitting device chips 130. Further, the transparent resin 160 includes a phosphor material so as to emit predetermined fluorescent light. For example, when the light-emitting device chip 130 is a blue LED chip or an UV LED chip, the transparent resin 160 may include yellow, red, and green phosphor material powder so as to emit white light.

In the current embodiment, the light-emitting device chips 130 are installed inside the reflection cavity 150 through wire bonding, but the present invention is not limited thereto.

In addition to the structure illustrated in FIG. 7, a structure in which the light-emitting device chips 130 are mounted on the lead frame 110 may vary. For example, a lens may further be disposed on the light-emitting device chip 130, or alternatively, the reflection cavity 150 may be omitted. Alternatively, the light-emitting device chips 150 may be mounted on the lead frame 110 through flip-chip bonding.

A bonding structure of the light-emitting device chips 130, a detailed structure in which light emitted from the light-emitting device chips 130 is output, and modified structures of the light source module 100 including various deformations of the lead frame 110 are disclosed in Korean Patent Application No. 2010-0038180 filed by the present applicant, and the disclosed examples may be employed in the present invention.

In addition, in the above description, the light source module 100 employs the lead frame 110 structure in which the mounted light-emitting device chips 130 are connected to one another in series, but this is just an example. For example, the lead frame 110 having a structure in which the mounted light-emitting device chips 130 are connected to one another in parallel may be employed, or alternatively, the lead frame 110 having a structure in which the light-emitting device chips 130 are connected to one another on a circuit both in series and parallel may be employed.

In addition, in the above description, the single light source module 100 is employed as a light source unit, but this is just an example. A plurality of the light source modules 100 may be employed as a light source unit. For example, the light source unit may employ a plurality of the light source modules 100 in which the light-emitting device chips 130 are connected on a circuit in series or are connected to one another in parallel. Alternatively, the light-emitting device chips 130 and the plurality of light source modules 100 may also be freely connected one another on a circuit both in series and parallel.

Figure 9:
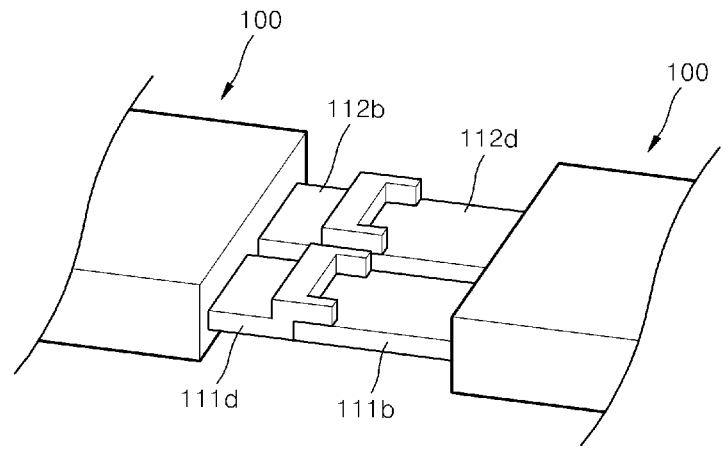
FIG. 9 illustrates a connection structure when a plurality of light source modules are employed as a light source unit of the illumination apparatus of FIG. 1.

FIG. 9 illustrates a connection structure when the plurality of light source modules 100 are employed as a light source unit of the illumination apparatus 300 of FIG. 1. The number of light source modules 100 constituting the light source unit may be determined in consideration of the size and luminance of the illumination apparatus 300. The adjacent light source modules 100 may be connected to each other by coupling a rear terminal unit of the light source module 100 and a front terminal unit of the adjacent light source module 100 through soldering. In this case, the shapes of the front terminal unit and rear terminal unit may be different to each other a little. That is, a first front terminal 111b and a second front terminal 112d constituting a front terminal unit are formed in a straight and flat shape, and a first rear terminal 111d and a second rear terminal 112b constituting a rear terminal unit are formed in a bent shape so as to engage with the first front terminal 111b and the second front terminal 112d. The first rear terminal 111d and the second rear terminal 1112b may be bent, and in one end of the bent portion thereof, another bent shape, for example, 'C' shape as illustrated in FIG. 9 is formed. When the first front terminal 111*b* and the second front terminal 112*d* are respectively coupled to the first rear terminal 111*d* and the second rear terminal 112*b* through soldering, the 'C'-shaped part formed in the first rear terminal 111*d* and the second rear terminal 112*b* may be coupled to a point at the junction of the first front terminal 111*b* and the second front terminal 112*d* through soldering. When the soldering is performed as described above, lead remains only around a concave part of the 'C'-shaped part and hardly drops down, and thus the soldering may be performed neatly without polluting the surroundings. In addition, a tensile force is also excellent, and thus intervals between the light source modules 100 may be easily maintained constant when connecting the light source modules 100.

Figure 10A:
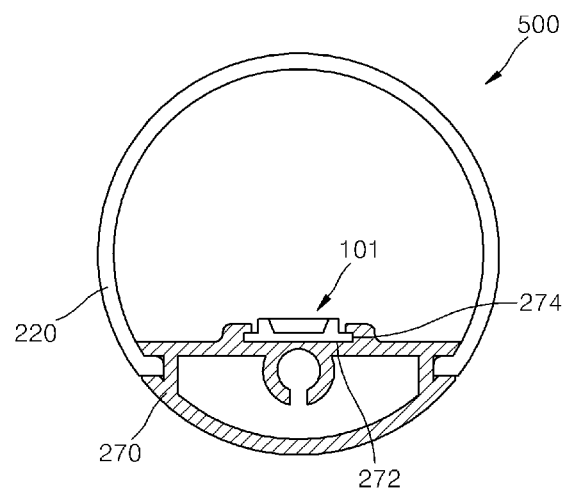
FIG. 10A is a schematic cross-sectional view illustrating an illumination apparatus according to another embodiment of the present invention.
Figure 10B:
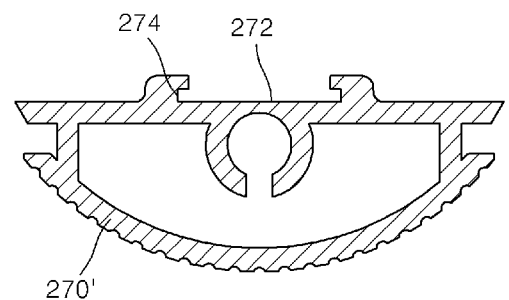
FIG. 10B illustrates a modified example of heat radiation structure employed in the illumination apparatus of FIG. 10A.
Figure 11:
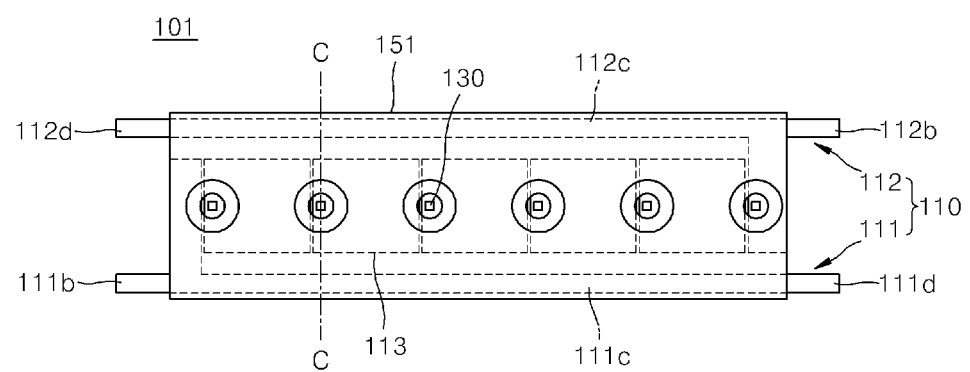
FIG. 11 is a schematic plane view illustrating a light source module employed in the illumination apparatus of FIG. 10A.
Figure 12:
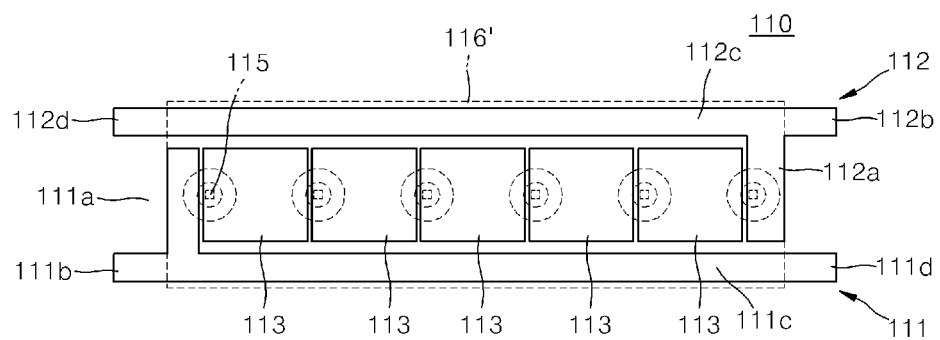
FIG. 12 is a schematic view illustrating a position relation between a lead frame and a light-emitting device chip used in the light source module of FIG. 11.
Figure 13:
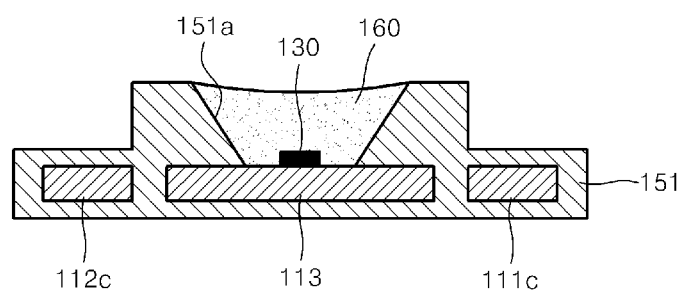
FIG. 13 is a schematic cross-sectional side view taken along a line C-C' of the light source module of FIG. 11.

FIG. 10A is a schematic cross-sectional view illustrating an illumination apparatus 500 according to another embodiment of the present invention. FIG. 10B illustrates a modified example of heat radiation structure employed in the illumination apparatus of FIG. 10A. FIG. 11 is a schematic plane view illustrating a light source module 101 employed in the illumination apparatus 300 of FIG. 10A. FIG. 12 is a schematic view illustrating a position relation between a lead frame and a light-emitting device chip used in the light source module 101 of FIG. 11. FIG. 13 is a schematic cross-sectional side view taken along a line C-C' of the light source module 101 of FIG. 11.

The light source module 101 employed in the illumination apparatus 500 according to the current embodiment is different from the light source module 100 of the illumination apparatus 300 of FIG. 1 in that the lead frame, except for a terminal unit, is coated with an insulating material. Details of the light source module 101 will be described later with reference to FIGS. 11 through 13.

The configuration of the illumination apparatus 500 is different from that of the illumination apparatus 300 of FIG. 1 due to the above difference of the light source module 101, which will be mainly described below.

The installation portion 270 in which the light source module 101 is installed has a heat radiation structure. The heat radiation structure is formed of a metal-based material such as Cu or Al and may include curves or patterns for increasing a surface area in order to effectively discharge heat. For example, as illustrated in FIG. 10B, an installation portion 270' having a heat radiation structure including groove pattern may be employed in the light source module 101.

The installation portion 270 may include a loading plate 272 on which the light source module 101 is loaded, and two engaging portions 274 that each include a groove and are formed at both sides of the loading plate 272 so as to engage with both edges of the light source module 101. The engaging portion 274 may be formed to be lower than a center portion of the light source module 101 loaded on the loading plate 272 so that light emitted from the light source module 101 does not interfere with the heat radiation structure. The installation portion 270 including the loading plate 272 and the engaging portions 274 may be formed to have various shapes. For example, as illustrated in FIG. 10A and FIG. 10B, the installation portion 270 may include at least a part of a cylinder, a diameter of which may correspond to that of a diffusion cover 220. However, the present invention is not limited thereto.

The diffusion cover 220 includes a part of a cylinder, but the present invention is not limited thereto. For example, as described above with respect to the diffusion cover 210 of FIGS. 1 through 3, the diffusion cover 220 may be formed to have a shape including a part of a cylindrical shape, for example, an oval shape, a polyhedral shape, a polyhedral shape of which edges are rounded, or the like.

The loading plate 272 extends in a direction parallel to an axis of the cylinder, and may be disposed to be lower than a center of the cylinder, thereby improving color uniformity and luminance uniformity by increasing a distance between the light source module 101 and the diffusion cover 220, as described above with respect to the illumination apparatus 300.

Details of the light source module 101 will be described below with reference to FIGS. 11 through 13. In the light source module 101 of the current embodiment, only first front and rear terminal units 111*b* and 111*d* and second front and rear terminal units 112*b* and 112*d* are exposed, and the remaining regions are coated with an insulating material. The insulating material may be used to form a reflection cavity 151. That is, the light source module 101 of the current embodiment is different from the light source module 100 of FIGS. 4 through 8 due to the shape of the reflection cavity 151. Accordingly, the reflection cavity 151 will be mainly described below.

Referring to FIGS. 11 through 13, the reflection cavity 151 extends in a direction perpendicular to a direction of arrangement of the light-emitting device chips 130 and covers a first extending portion 111*c* and a second extending portion 112*c*. That is, a reflection cavity forming unit 116' externally covers the first extending portion 111*c* and the second extending portion 112*c*. The reflection cavity 151 may be formed of an insulating resin. The reflection cavity 151 extends over the first extending portion 111*c* and the second extending portion 112*c*, so that the reflection cavity 151 may fix and couple the first extending portion 111*c* and the second extending portion 112*c*, as well as a first connecting portion 111*a*, intermediate connecting portions 113, and a second connecting portion 112*a*. Accordingly, in the current embodiment, a lead frame 110 may be fixed and coupled as one body by the reflection cavity 151 without using an additional coupling member (120 of FIG. 4). Further, the reflection cavity 151 externally covers the first extending portion 111*c* and the second extending portion 112*c*, thereby improving an insulating property of the light source module 101.

A thickness of the reflection cavity 151 is not constant, a predetermined peripheral region of the light-emitting device chip 130 has a thickness suitable for forming a reflection surface 151*a*, and a thickness of a peripheral region of the predetermined peripheral region may be thin. That is, the thickness of the reflection cavity 151 may be thinner in upper regions of the first extending portion 111*c* and the second extending portion 112*c* considering that the engaging portion 274 of the installation portion 270 having a heat radiation structure is lower than a center portion of the light source module 101. That is, a thickness of the peripheral region of the reflection cavity 151 may be formed to be thin so as to engage the both edges of the light source module 101 with the grooves of the engaging portions 274.

The reflection cavity 151 may be disposed in upper and lower portions of the lead frame 110 in which the light-emitting device chips 130 are mounted as illustrated in FIG. 13. However, this is just an example, the reflection cavity 151 may be disposed only in the upper portion of the lead frame 110, and the lower portion of the lead frame 110 may be exposed. In this case, heat may further be effectively discharged from the light-emitting device chips 130.

The illumination apparatus 500 of the current embodiment may also employ a connection structure when light source modules 101 are employed as described in FIG. 9. That is, a terminal unit of the light source module 101 is modified as described in FIG. 9, and the light source modules 101 are connected to one another through soldering. In this case, the soldering may be performed before installing or after installing the light source module 101 in the installation portion 270 having a heat radiation structure.

In an illumination apparatus according to the above embodiments, a circuit of light-emitting device chips is formed in a lead frame, thereby reducing manufacturing cost by using a light source module capable of being easily packaged.

Also, when a lead frame uses an exposed structure, an additional heat radiation structure is not formed, thereby forming a light illumination apparatus.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An illumination apparatus, comprising:
   a light source unit comprising at least one light source module comprising a plurality of light-emitting device chips and a lead frame on which the light-emitting device chips are disposed and which connects the disposed light-emitting device chips;
   a diffusion cover having an interior space in which the light source module is accommodated and diffusing light emitted from the light source module, the diffusion cover having at least one hole through which heat from the light source unit is emitted; and
   an installation portion disposed adjacent to the diffusion cover to install the light source module,
   wherein the installation portion is divided into two parts spaced apart by interposing the light source module therebetween, and each of the two parts comprises a groove with which the light source module is engaged.

2. The illumination apparatus of claim 1, wherein the lead frame comprises a plurality of mounting portions on which the light-emitting device chips are mounted, a plurality of connecting portions for connecting the light-emitting device chips on a circuit, and a terminal unit extending from at least one of the connecting portions.

3. The illumination apparatus of claim 2, wherein the connecting portions comprise an intermediate connecting portion for connecting the mounted light-emitting device chips in series, a first connecting portion electrically connected to a first electrode of the light-emitting device chip disposed at a front end of a series circuit from among the mounted light-emitting device chips, and a second connecting portion electrically connected to a second electrode of the light-emitting device chip disposed at a rear end of the series circuit from among the mounted light-emitting device chips,
   wherein the terminal unit comprises a first terminal extending from the first connecting portion and a second terminal extending from the second connecting portion.

4. The illumination apparatus of claim 3, wherein the first connecting portion, the intermediate connecting portion, and the second connecting portion are arranged in a line;
   the first terminal comprises a first front terminal disposed at a front end of the arrangement and a first rear terminal disposed at a rear end of the arrangement;
   the second terminal comprises a second front terminal disposed at a front end of the arrangement and a second rear terminal disposed at a rear end of the arrangement; and
   the connecting portion comprises a first extending portion extending from the first connecting portion to the first rear terminal along a side of the arrangement, and a second extending portion extending from the second connecting portion to the second front terminal along the other side of the arrangement.

5. The illumination apparatus of claim 2, wherein a region of the lead frame, other than the mounting portions, is exposed in the interior space.

6. The illumination apparatus of claim 4, wherein each of the first extending portion and the second extending portion is coupled to the intermediate connecting portion with a coupling member comprising an insulating material.

7. The illumination apparatus of claim 1, wherein a plurality of through-holes are formed in the installation portion.

8. The illumination apparatus of claim 5, wherein the diffusion cover has any one shape selected from the group consisting of a cylindrical shape, an oval shape, a polyhedral shape, and a polyhedral shape of which edges are rounded.

9. The illumination apparatus of claim 8, wherein the installation portion extends in a direction parallel to an axis of the shape of the diffusion cover and is disposed to be lower than a center of a cross-section of the shape of the diffusion cover.

10. The illumination apparatus of claim 2, wherein regions of the lead frame, except for the terminal unit, are coated with an insulating material.

11. The illumination apparatus of claim 10, wherein the installation portion has a heat radiation structure.

12. The illumination apparatus of claim 1, wherein the light source unit comprises a plurality of light source modules;
   a front terminal unit and a rear terminal unit are respectively disposed at both ends of each of the light source modules; and
   the rear terminal unit of any one light source module from among the light source modules is coupled to the front terminal unit of the adjacent light source module.

13. An illumination apparatus, comprising:
   a light source unit comprising at least one light source module comprising a plurality of light-emitting device chips and a lead frame on which the light-emitting device chips are disposed and which connects the disposed light-emitting device chips;
   a diffusion cover having an interior space in which the light source module is accommodated and diffusing light emitted from the light source module; and
   an installation portion disposed adjacent to the diffusion cover to install the light source module,
   wherein regions of the lead frame, except for the terminal unit, are coated with an insulating material,
   wherein the installation portion has a heat radiation structure,
   wherein the heat radiation structure comprises:
      a loading plate on which the light source module is loaded; and
      two engaging portions that each comprise a groove and are formed at both sides of the loading plate so as to engage with both edges of the light source module.

14. The illumination apparatus of claim 13, wherein a shape of the heat radiation structure comprises a part of a cylindrical shape.

15. The illumination apparatus of claim 14, wherein a shape of the heat radiation structure comprises groove patterns.

16. The illumination apparatus of claim 13, wherein:
   the diffusion cover comprises a part of any one shape selected from the group consisting of a cylindrical shape, an oval shape, a polyhedral shape, and a polyhedral shape of which edges are rounded, and the loading plate extends in a direction parallel to an axis of the shape of the diffusion cover and is disposed to be lower than a center of a cross-section of the shape of the diffusion cover.

17. An illumination apparatus, comprising:

a light source unit comprising a plurality of light source modules, at least one of which comprises a plurality of light-emitting device chips and a lead frame on which the light-emitting device chips are disposed and which connects the disposed light-emitting device chips;

a diffusion cover having an interior space in which the at least one light source module is accommodated and diffusing light emitted from the at least one light source module;

an installation portion disposed adjacent to the diffusion cover to install the light source module;

a front terminal unit having a straight line shape and a rear terminal unit having a bent shape so as to engage with the front terminal unit, an end of the bent shape of the rear terminal unit being bent to have a concave part, the front terminal unit and the rear terminal unit being respectively disposed at both ends of each of the plurality of light source modules, wherein:

the installation portion is divided into two parts spaced apart by interposing the light source module therebetween, and each of the two parts comprises a groove with which the light source module is engaged, and the rear terminal unit of any one light source module from among the light source modules is coupled to the front terminal unit of an adjacent light source module.

18. The illumination apparatus of claim 17, wherein the end of the bent shape of the rear terminal unit is formed in a 'C'-shape.

19. The illumination apparatus of claim 17, wherein when the rear terminal unit of any one light source module from among the light source modules is coupled to the front terminal unit of the adjacent light source module through soldering, the junction of the end of the bent shape of the rear terminal unit and the front terminal is soldered.

* * * * *